United States Patent
Mohammed et al.

(10) Patent No.: US 9,461,196 B2
(45) Date of Patent: Oct. 4, 2016

(54) NON-CRYSTALLINE INORGANIC LIGHT EMITTING DIODE

(71) Applicant: Invensas Corporation, San Jose, CA (US)

(72) Inventors: Ilyas Mohammed, Santa Clara, CA (US); Liang Wang, Milpitas, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/605,550

(22) Filed: Jan. 26, 2015

(65) Prior Publication Data

US 2015/0129876 A1   May 14, 2015

Related U.S. Application Data

(63) Continuation of application No. 13/725,923, filed on Dec. 21, 2012, now Pat. No. 8,941,111.

(51) Int. Cl.
| | |
|---|---|
| *H01L 33/10* | (2010.01) |
| *H01L 33/00* | (2010.01) |
| *H01L 33/18* | (2010.01) |
| *H01L 33/16* | (2010.01) |
| *H05B 33/14* | (2006.01) |

(Continued)

(52) U.S. Cl.
CPC ....... *H01L 33/0012* (2013.01); *H01L 33/0095* (2013.01); *H01L 33/14* (2013.01); *H01L 33/16* (2013.01); *H01L 33/18* (2013.01); *H01L 33/36* (2013.01); *H01L 33/486* (2013.01); *H05B 33/14* (2013.01); *H05B 33/22* (2013.01); *H01L 2933/0016* (2013.01); *H01L 2933/0033* (2013.01)

(58) Field of Classification Search
CPC ....... H01L 33/28; H01L 33/62; H01L 33/10; H01L 33/12; H01L 33/14; H01L 33/16; H01L 33/0095; H01L 33/486
USPC ......................................................... 257/52
See application file for complete search history.

(56) References Cited

U.S. PATENT DOCUMENTS

| | | | |
|---|---|---|---|
| 5,625,255 A | 4/1997 | Watanabe | |
| 6,111,274 A | 8/2000 | Arai | |

(Continued)

FOREIGN PATENT DOCUMENTS

| | | |
|---|---|---|
| EP | 1806791 A2 | 7/2007 |
| JP | 2008277669 | 11/2008 |

(Continued)

OTHER PUBLICATIONS

Publication of PCT Publication No. WO 2014/099443 dated Jun. 26, 2014 with International Search Report dated May 14, 2014, 50 pages.

*Primary Examiner* — Nathan W Ha
(74) *Attorney, Agent, or Firm* — Forefront IP Lawgroup, PLLC (57) ABSTRACT

Non-crystalline inorganic light emitting diode. In accordance with a first embodiment of the present invention, an article of manufacture includes a light emitting diode. The light emitting diode includes a non-crystalline inorganic light emission layer and first and second semiconducting non-crystalline inorganic charge transport layers surrounding the light emission layer. The light emission layer may be amorphous. The charge transport layers may be configured to inject one type of charge carrier and block the other type of charge carrier.

18 Claims, 7 Drawing Sheets

(51) Int. Cl.
   *H05B 33/22*   (2006.01)
   *H01L 33/14*   (2010.01)
   *H01L 33/36*   (2010.01)
   *H01L 33/48*   (2010.01)

(56) References Cited

U.S. PATENT DOCUMENTS

| | | |
|---|---|---|
| 6,706,551 B2 | 3/2004 | Andriessen |
| 7,649,196 B2 | 1/2010 | Tischler et al. |
| 7,777,233 B2 | 8/2010 | Kahen et al. |
| 7,902,747 B2 | 3/2011 | Yamazaki et al. |
| 7,919,342 B2 | 4/2011 | Cok |
| 8,569,743 B2 | 10/2013 | Birnstock et al. |
| 8,941,111 B2 | 1/2015 | Mohammed et al. |
| 2003/0062529 A1 | 4/2003 | Kato et al. |
| 2006/0260674 A1 | 11/2006 | Tran |
| 2009/0101928 A1 | 4/2009 | Kim et al. |
| 2009/0116277 A1 | 5/2009 | Tran |
| 2009/0194839 A1 | 8/2009 | Bertin et al. |
| 2010/0289001 A1* | 11/2010 | Kahen .............. C09K 11/025 257/13 |
| 2011/0140101 A1 | 6/2011 | Noda |
| 2012/0104440 A1 | 5/2012 | Peng et al. |

FOREIGN PATENT DOCUMENTS

| | | |
|---|---|---|
| WO | 2006088877 A1 | 8/2006 |
| WO | 2009058172 A1 | 5/2009 |
| WO | 2012158252 A1 | 11/2012 |

* cited by examiner

NON-CRYSTALLINE INORGANIC LIGHT EMITTING DIODE

FIELD OF INVENTION

Embodiments of the present invention relate to the field of integrated circuit design and manufacture. More specifically, embodiments of the present invention relate to systems and methods for non-crystalline inorganic light emitting diodes.

BACKGROUND

Light emitting diodes (LEDs) are gaining wide acceptance in a variety of area-illumination applications, for example, architectural lighting, residential illumination, industrial lighting, outdoor lighting, theatrical lighting and the like. Crystalline inorganic LEDs based on Gallium nitride (GaN) are a common type of LEDs utilized in such applications.

In comparison to conventional organic light emitting diodes (OLEDs), crystalline inorganic LEDs offer a number of advantages, including superior brightness, e.g., brightness in the range of 6900 klm/m$^2$ for LED in comparison to about 10 klm/m$^2$ for OLED, increased efficiency, e.g., 144 lm/W for LED in comparison to 60 lm/W for OLED, advantageous lifetime, e.g., 50,000 hours for LEDs versus 10,000 hours for a blue OLED, and a beneficially increased current density, e.g., 35 A/cm$^2$ for an LED in comparison to about 10 mA/cm$^2$ for an OLED.

However, organic light emitting diodes have some advantages in comparison to inorganic crystalline light emitting diodes. Organic LEDs may be constructed as an area light source, whereas crystalline inorganic LEDs are generally point sources, often rendering such LEDs unsuitable for, or requiring complex optics for, area lighting applications. In addition, crystalline inorganic LEDs generally require an epitaxial growth process, which is generally considered an expensive process, e.g., requiring high vacuum and long durations. Further, crystalline inorganic LEDs often require a lattice-matched single crystal substrate, e.g., sapphire or Silicon carbide, which are generally more expensive than other substrates, and may often have less desirable optical and/or thermal properties. Still further, even a slight mismatch in a crystal lattice or in a coefficient of thermal expansion (CTE) between a substrate and an epitaxial layer grown at high temperature may result in interfacial defects, dislocations and/or cracks, which may significantly lower the production yield. In contrast, organic LEDs are generally amorphous, do not require epitaxial growth and offer greater variety of substrate selection, lower material and manufacturing costs, and higher manufacturing throughput and yield.

SUMMARY OF THE INVENTION

Therefore, what is needed are systems and methods for non-crystalline inorganic light emitting diodes. What is additionally needed are systems and methods for non-crystalline inorganic light emitting diodes that do not require epitaxial manufacturing processes, such as chemical vapor deposition (CVD) or molecular beam epitaxy (MBE). A further need exists for systems and methods for non-crystalline inorganic light emitting diodes that are compatible and complementary with existing systems and methods of integrated circuit design, manufacturing and test. Embodiments of the present invention provide these advantages.

In accordance with a first embodiment of the present invention, an article of manufacture includes a light emitting diode. The light emitting diode includes a non-crystalline inorganic light emission layer and first and second semiconducting non-crystalline inorganic charge transport layers surrounding the light emission layer. The light emission layer may be amorphous. The charge transport layers may be configured to inject one type of charge carrier and block the other type of charge carrier.

In accordance with another embodiment of the present invention, an article of manufacture includes a light emitting diode. The light emitting diode includes a first non-crystalline inorganic layer configured for transporting holes and blocking electrons and having a hole conduction band and a hole valence band. The light emitting diode also includes a second non-crystalline inorganic layer, disposed on the first layer, configured for emitting light and having an emission conduction band and a emission valence band. The light emitting diode further includes a third non-crystalline inorganic layer, disposed on the second layer, configured for transporting electrons and blocking holes and having an electron conduction band and an electron valence band. The alignment of the hole, emission and electron conduction bands and the hole, emission and electron valence bands favor both charge injection and charge confinement.

In accordance with a further embodiment of the present invention, an article of manufacture includes a light emitting device. The light emitting device includes a first diode unit including a first non-crystalline inorganic light emission layer configured to emit light of a first wavelength and first and second non-crystalline inorganic charge transport layers surrounding the first light emission layer. The light emitting device includes a second diode unit including a second non-crystalline inorganic light emission layer configured to emit light of a second wavelength and third and fourth non-crystalline inorganic charge transport layers surrounding the second light emission layer.

The light emitting device includes a non-crystalline inorganic charge generation layer between the first and second diode units. An anode terminal of the first diode unit is coupled to a cathode terminal of the second anode unit, and the first and second diode units and the charge generation layer form a single stack of materials. The first and second wavelengths may be substantially the same or different. The light emitting device may be configured to produce white light.

In accordance with a method embodiment of the present invention, a non-crystalline anode material is deposited on a non-crystalline substrate. A first non-crystalline charge transport material is deposited on the anode material. The first charge transport material includes a semiconductor material. Non-crystalline light emitting material is deposited on the charge transport material. A second non-crystalline charge transport material is deposited on the light emitting material. The second charge transport material includes a semiconductor. Non-crystalline cathode material is deposited on the second charge transport material, to form a light emitting diode. The light emitting diode may be annealed.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

DETAILED DESCRIPTION

Reference will now be made in detail to various embodiments of the invention, non-crystalline inorganic light emitting diode, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

Some portions of the detailed descriptions which follow (e.g., process 400) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "depositing" or "processing" or "sputtering" or "coating" or "placing" or "slicing" or "forming" or "mounting" or "applying" or "roughening" or "filling" or "accessing" or "performing" or "generating" or "adjusting" or "creating" or "executing" or "continuing" or "indexing" or "computing" or "translating" or "calculating" or "determining" or "measuring" or "gathering" or "running" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

References herein to "conduction band" and/or "valence band" refer to the bottom of a conduction band and the top of a valence band. In addition, any values presented for such bands are referenced from the vacuum level, which is above the entire conduction band, so both "conduction band" and "valence band" values are presented as negative numbers.

Non-Crystalline Inorganic Light Emitting Diode

Figure 1A:
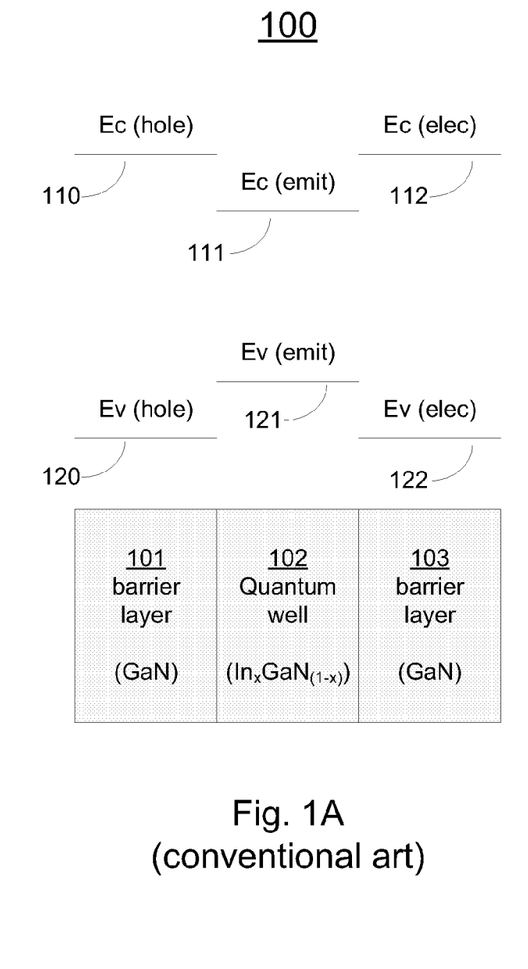
FIG. 1A illustrates an energy band alignment for a crystalline inorganic light emitting diode in accordance with the conventional art.
Figure 1B:
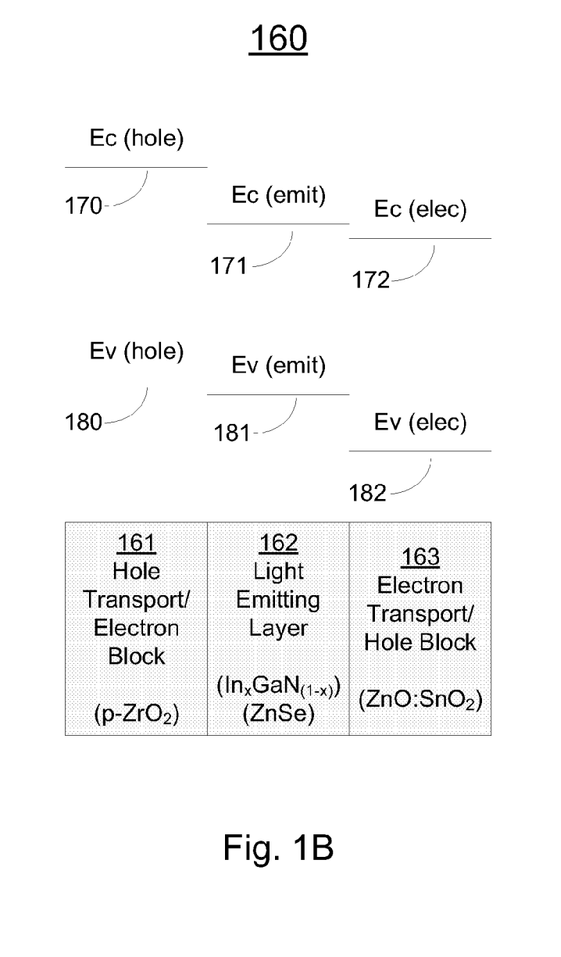
FIG. 1B illustrates an energy band alignment for a non-crystalline inorganic light emitting diode in accordance with embodiments of the present invention.

FIGS. 1A and 1B illustrate a comparison of energy band diagrams for a crystalline inorganic light emitting diode in accordance with the conventional art (100, FIG. 1A) and a non-crystalline inorganic light emitting diode in accordance with embodiments of the present invention (160, FIG. 1B). The Figures are not to scale and indicate only general relationships, for example, one energy level is greater or less than another energy level, and/or two energy levels are relatively close or relatively distant. The vertical dimension indicates electron energy, e.g., measured in electron volts (eV). The energy levels illustrated indicate the bottom, e.g., lowest energy, of a conduction band or the top, e.g., highest energy, of a valence band. The indicated materials comprising various layers are exemplary and not limiting.

In FIG. 1A, an exemplary energy band alignment diagram for a conventional crystalline inorganic light emitting diode is illustrated. For example, the light emitting diode may be gallium nitride (GaN) based, and constructed on a sapphire ($—Al_2O_3$) substrate. In general, a conventional crystalline inorganic light emitting diode employs a quantum well structure for light emission. For example, barrier layers 101 and 103 have a relatively larger bandgap, e.g., a difference between conduction and valence bands, than a bandgap of layer 102, which is "sandwiched" between barrier layers 101 and 103.

As illustrated in FIG. 1A, the energy difference between the conduction band of hole transport layer $E_C$(hole) 110 and the valence band of hole transport layer $E_V$(hole) 120 is greater than the energy difference between the conduction band of emission layer $E_C$(emit) 111 and the valence band of emission layer $E_V$(emit) 121. Similarly, the energy difference between the conduction band of electron transport layer $E_C$(elec) 112 and the valence band of electron transport layer $E_V$(elec) 122 is similar to the energy difference between 110 and 120, and is greater than the energy difference between the conduction band of emission layer $E_C$(emit) 111 and the valence band of emission layer $E_V$(emit) 121. Such a quantum well structure generally requires a crystalline structure.

FIG. 1B illustrates an exemplary energy band alignment diagram for a non-crystalline inorganic light emitting diode, in accordance with embodiments of the present invention. Holes are injected into light emitting layer 162 from hole transport/electron blocking layer 161, while holes are blocked by electron transport/hole blocking layer 163. Similarly, electrons are injected into light emitting layer 162 from electron transport/hole blocking layer 163, while electrons are blocked by hole transport/electron blocking layer 161. It is to be appreciated that this layup and configuration of materials does not require a crystalline structure to confine charge.

In order emit light efficiently, the valence band 181 of the emitting layer 162 should be close to the valence band 180 of the hole transport/electron blocking layer 161. For example, an exemplary light emitting layer 162 comprising indium gallium nitride ($In_{(0.15)}GaN_{0.85}$) may be characterized as having a valence band of −7.2 eV, while an exemplary hole transport/electron blocking layer 161 comprising p-doped zirconium dioxide (p-$ZrO_2$) may be characterized as having a valence band of −7.4 eV. Similarly, the conduction band 171 of the emitting layer 162 should be close to the conduction band 172 of electron transport/hole blocking layer 163. For example, the conduction band of the same exemplary light emitting layer 162 may be characterized as having a conduction band of −4.4 eV, while an exemplary electron transport/hole blocking layer 163 comprising n-doped zinc oxide ($ZnO:SnO_2$) may be characterized as having a conduction band of −4.2 eV. Thus, holes and electrons are easily injected into the emitting layer 162 for recombination.

In addition, the conduction band 170 of the hole transport/electron blocking layer 161 should be higher than the conduction band 171 of emission layer 162. For example, the conduction band of the same exemplary hole transport/electron blocking layer 161 is −1.6 eV, while the conduction band of the same exemplary light emitting layer 162 is −4.4 eV. Similarly, the valence band 182 of the electron transport/hole blocking layer 163 should be deeper than the valence band 181 of emission layer 162. For example, the valence band of the same exemplary electron transport/hole blocking layer 163 is −7.6 eV, while the valence band of the same exemplary light emitting layer 162 is −7.2 eV. Thus, holes and electrons are effectively confined within the light emitting layer 162, where they recombine to emit light.

In comparison, the energy band alignments for a crystalline inorganic light emitting diode in accordance with the conventional art (FIG. 1A) and a non-crystalline inorganic light emitting diode in accordance with embodiments of the present invention (FIG. 1B) are quite different. While both structures may utilize inorganic materials, the selection of material forms to achieve the energy band alignment of FIG. 1B enables non-crystalline, e.g., amorphous, polycrystalline and/or nanocrystalline, materials to effectively and efficiently transport charges and produce light, in accordance with embodiments of the present invention.

Figure 2:
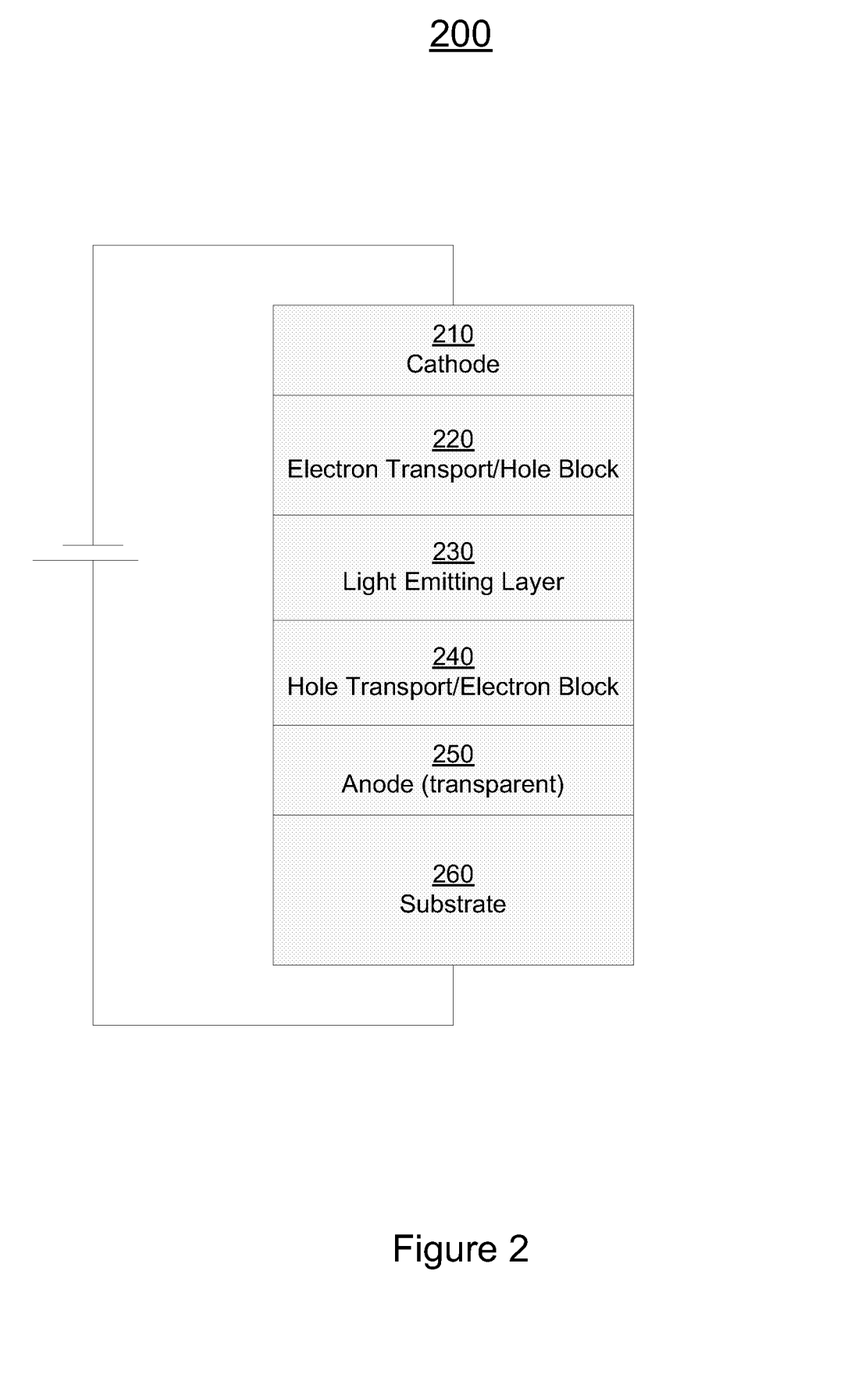
FIG. 2 illustrates a side sectional view of a non-crystalline inorganic light emitting diode, in accordance with embodiments of the present invention.

FIG. 2 illustrates a side sectional view of a non-crystalline inorganic light emitting diode 200, in accordance with embodiments of the present invention.

Non-crystalline inorganic light emitting diode 200 comprises an electron transport/hole block layer 220, disposed on a light emitting layer 230, disposed on a hole transport/electron blocking layer 240. In accordance with embodiments of the present invention, layers 220, 230 and 240 comprise non-crystalline, inorganic materials.

In accordance with embodiments of the present invention, electron transport/hole block layer 220 may comprise, for example, n-doped gallium nitride (n-GaN), an n-doped zinc oxide, e.g., zinc stannate (ZTO or $ZnO:SnO_2$), and/or n-type titanium dioxide ($TiO_2$). Hole transport/electron blocking layer 240 may comprise p-doped aluminum gallium nitride (p-AlGaN), zirconium dioxide (p-$ZrO_2$), tantalum pentoxide (p-$Ta_2O_5$), hafnium oxide (p-$HfO_2$) and/or p-doped nickel oxide (p-NiO). Layers 220 and 240 may be, for example, from about 4 nm to about 1000 nm in thickness. Layers 220 and 240 may be substantially the same thickness, although that is not required. In order to transport one type of charge, e.g., holes, while blocking the other type of charge, e.g., electrons, the layers 220 and 240 should comprise semiconducting materials, and may be doped. In accordance with embodiments of the present invention, the layers 220, 230 and 240 may be configured for relatively high current densities, e.g., in comparison to current densities available in organic light emitting diodes. For example, current densities of layers 220, 230 and 240 may be up to about 35 A/cm$^2$.

The light emitting layer 230 may comprise a group III-V compound, e.g., indium gallium nitride ($In_xGaN_{(1-x)}$), and/or a group II-VI compound, e.g., zinc selenide (ZnSe). The light emitting layer 230 may be, for example, from about 4 nm to about 500 nm in thickness. These materials may produce a blue light, in some embodiments.

In accordance with embodiments of the present invention, other materials may produce a variety of colors. For example, gallium arsenide (GaAs) and/or indium gallium arsenide (InGaAs) may produce infra red light. Aluminum gallium arsenide (AlGaAs) and/or gallium arsenide phosphide (GaPAs) may produce red light. Aluminum gallium indium phosphide (AlGaInP) may produce a red-orange, orange or amber light. Gallium phosphide (GaP) and/or gallium indium nitride (GaInN) may produce a green light. Cadmium zinc selenide (CdZnSe) may produce a blue-green light. Aluminum gallium nitride (AlGaN) may produce light in the ultraviolet portion of the spectrum. Embodiments in accordance with the present invention are well suited to other materials in any or all of a light emitting layer, an electron transport/hole block layer and/or a hole transport/electron blocking layer.

Cathode 210 may comprise any suitable material, e.g., aluminum (Al), and may be transparent or reflective in some embodiments. The thickness of cathode 210 may be determined based on desired electrical conductivity and/or optical properties, e.g., reflectivity. In an exemplary aluminum embodiment, cathode 210 may be greater than about 50 nm thick. Anode 250 may comprise any suitable material, e.g., indium tin oxide (ITO), and may beneficially be transparent, in some embodiments. The thickness of anode 250 may be determined based on desired electrical conductivity and/or optical properties, e.g., transparency. In an exemplary ITO embodiment, anode 250 may be from about 100 nm to about 300 nm thick. In other embodiments, anode 250 may be beneficially reflective.

Under the conventional art, the substrate of a crystalline inorganic light emitting diode is constrained to have a lattice-matched single crystal structure, for example, sapphire (—$Al_2O_3$) or Silicon carbide. In addition to the relative expense of substrates based on these materials, such substrates generally do not have desirable optical, electrical and/or thermal properties for use in light emitting diodes. In contrast, in accordance with embodiments of the present invention, a wide variety of substrates may be utilized in formation of non-crystalline inorganic light emitting diodes, including, for example, glass, ceramics, polymers and/or metals. Such substrates may be selected for optical, thermal, electrical, manufacturing and/or other characteristics or design preferences, with less regard to a lattice-matched single crystal structure.

Accordingly, substrate 260 may comprise any suitable material. In accordance with embodiments of the present invention, substrate 260 is transparent. In accordance with embodiments of the present invention, substrate 260 comprises a material with high thermal conductivity. In accordance with embodiments of the present invention, substrate 260 comprises a material with high electrical conductivity. In accordance with embodiments of the present invention, substrate 260 may comprise metal, e.g., aluminum (Al), copper (Cu), silver (Ag) and/or gold (Au).

Figure 3:
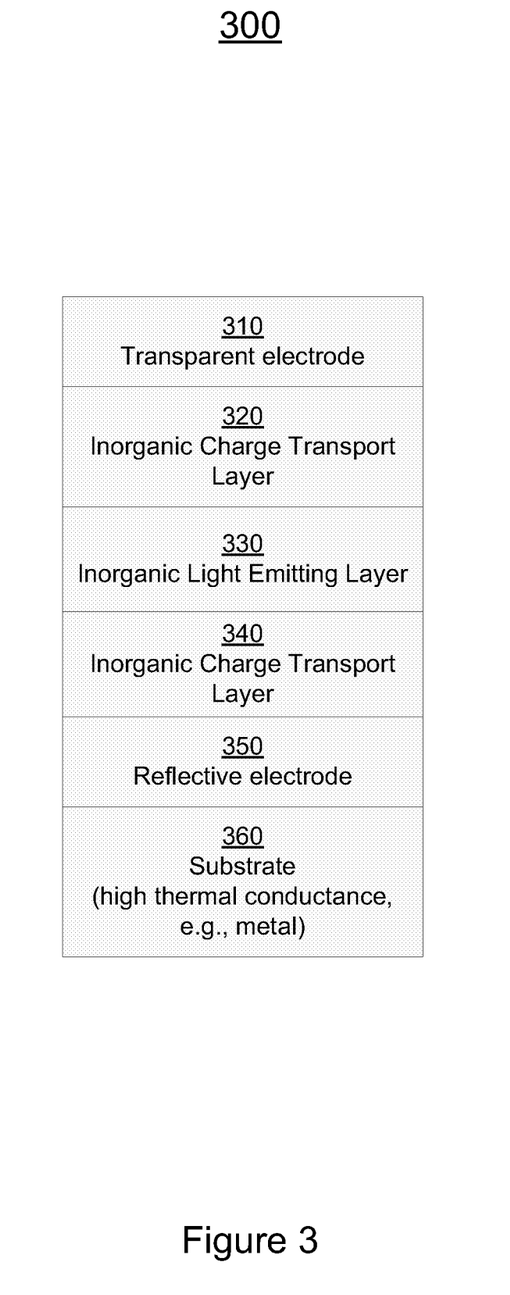
FIG. 3 illustrates a side sectional view of a non-crystalline inorganic light emitting diode, in accordance with embodiments of the present invention.

FIG. 3 illustrates a side sectional view of a non-crystalline inorganic light emitting diode 300, in accordance with embodiments of the present invention. Non-crystalline inorganic light emitting diode 300 comprises inorganic charge transport layers 320 and 340 surrounding an inorganic light emitting layer 330. At the top of light emitting diode 300 is a transparent electrode 310. Transparent electrode 310 allows light to escape from light emitting diode 300.

Disposed on inorganic charge transport layer 340, opposite from inorganic light emitting layer 330, is reflective electrode 350. Reflective electrode 350 reflects light incident from light emitting layer 330 toward transparent electrode 310, to increase the light output of light emitting diode 300.

The layers 350, 340, 330, 320 and 310 are formed on top of substrate 360. Substrate 360 has high thermal conductance, and may comprise metal, in some embodiments. It is appreciated that conventional crystalline inorganic LEDs are typically not produced on metal substrates. In this novel manner, light emitting diode 300 may have enhanced thermal management, e.g., thermal dissipation, in comparison to the conventional art. In accordance with embodiments of the present invention, a metal substrate may provide enhanced mechanical strength to a light emitting diode, in comparison to conventional art substrates.

Figure 4:
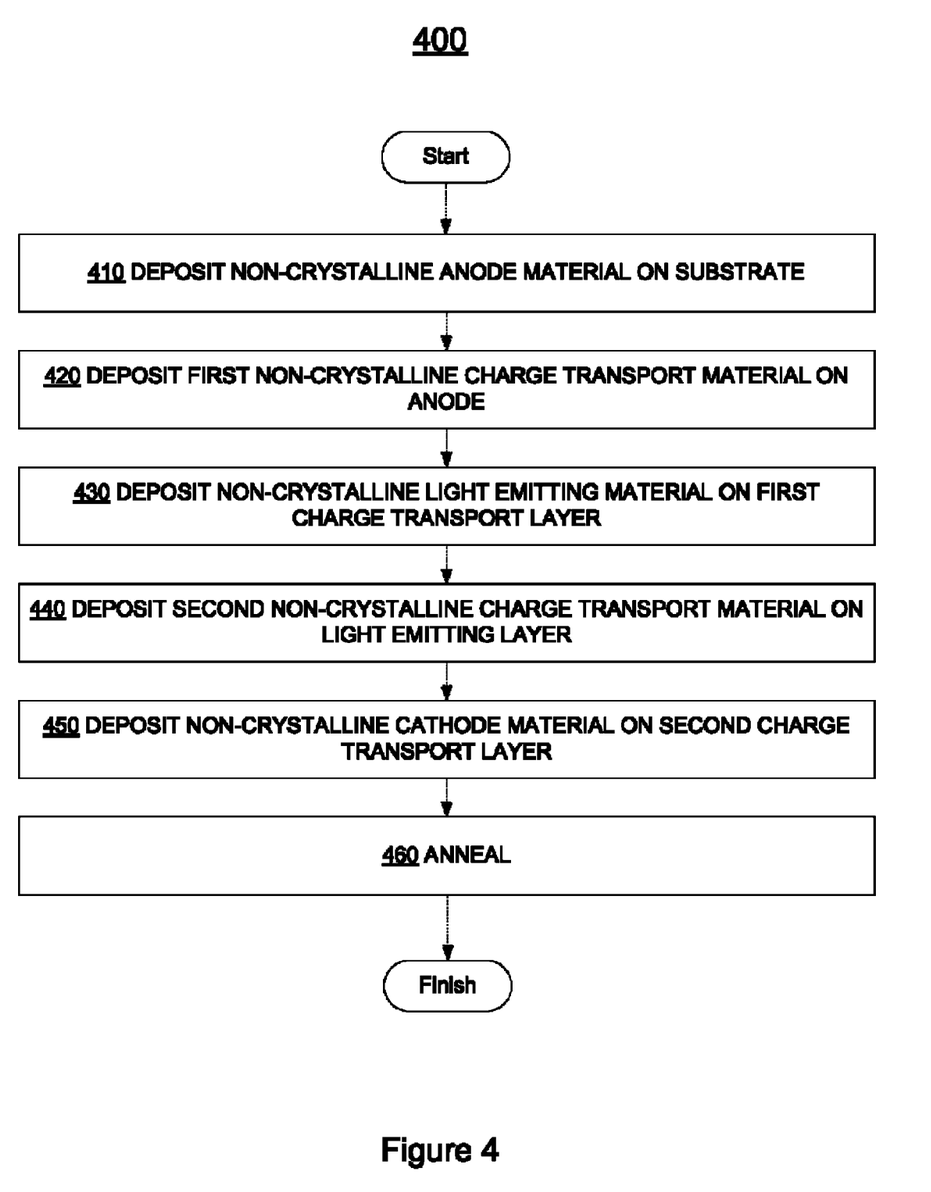
FIG. 4 illustrates a method of manufacturing a non-crystallite inorganic light emitting diode, in accordance with embodiments of the present invention.

FIG. 4 illustrates a method 400 of manufacturing a non-crystallite inorganic light emitting diode, in accordance with embodiments of the present invention. Method 400 begins with a substrate (not shown). As previously described, the substrate may comprise any suitable materials, including, e.g., polymers, glass, ceramic, metal and/or crystalline materials, and may be transparent. The substrate may be mechanically rigid or flexible, e.g., as may be desired for different applications, in some embodiments. It is appreciated that crystalline materials are not required, although they may be utilized. More particularly, embodiments in accordance with the present invention do not require a crystal lattice match between a substrate and materials applied to the substrate.

At 410, a non-crystalline anode material is deposited on a substrate forming an anode, or anode layer. The anode material may be transparent, in some embodiments. At 420, a first non-crystalline charge transport material is deposited on the anode layer, forming a charge transport layer. For example, the charge transport layer may transport holes, known as a hole transport layer (HTL). In addition, the charge transport layer may block electrons. The charge transport material may be doped, e.g., with a p-type dopant, during or subsequent to the deposition.

At 430, a non-crystalline light emitting material is deposited on the first charge transport layer, forming a light emitting layer. At 440, a second non-crystalline charge transport material is deposited on the light emitting layer, forming a charge transport layer. For example, the charge transport layer may transport electrons, known as an electron transport layer (HTL). In addition, the charge transport layer may block holes. The charge transport material may be doped, e.g., with an n-type dopant, during or subsequent to the deposition. At 450, a non-crystalline cathode material is deposited on the second charge transport layer, forming a cathode, or cathode layer. The deposition process may be a sputtering process.

The deposition processes in method 400 may comprise, for example, e-beam evaporation, thermal evaporation, sputtering, ion-assisted deposition, printing, spraying, blade casting and the like. The deposition may take place in batch or continuous, e.g., roll to roll, processes.

It is to be appreciated that embodiments in accordance with the present invention are well suited to variations of the above-described process. For example, the role of anode and cathode may be reversed, for example, a cathode may be applied to a substrate. In addition, the doping type of the two charge transport layers may be reversed.

In accordance with embodiments of the present invention, all layers of a non-crystallite inorganic light emitting diode may be deposited by a scalable technique, e.g., sputtering. In addition, all depositions may be made in the same chamber, beneficially reducing manufacturing time and equipment requirements. For example, in a typical sputtering tool, a plasma is formed in a chamber, and high-energy ions bombard the target materials so that the target atoms are liberated and subsequently deposited onto a substrate. In contrast, in a chemical vapor deposition/epitaxial tool, a higher level of vacuum is required. Precursor gases are introduced into a chamber and form the target material on the substrate, which is usually at a high temperature, by a chemical reaction or "growth" process. Sputtering is generally considered a physical process, characterized as fast and anisotropic. CVD/epitaxial growth is generally considered to be a chemical process, characterized as slow and isotropic.

In optional 460, the entire stack of materials is annealed. For example, the fabricated stack may be annealed in an inert nitrogen atmosphere at about 200° C. to about 400° C. for about one half to three hours. Such annealing may form a smaller grain size, an improved interfacial contact and a more ordered microstructure, improving charge transport in the charge transport layers, beneficially lowering drive voltage requirements. In addition, annealing may reduce a density of defects which may act as recombination centers, thereby improving quantum efficiency. In an alternative embodiment in accordance with the present invention, each layer may be annealed individually after deposition, e.g., via laser-based heating or halogen lamp heating. For example, the anode material is annealed after deposition on the substrate, and the charge transport layer is annealed after deposition on the anode. This alternative annealing process may enable application of different temperatures to each layer that are better matched for the different characteristics of each layer.

It is to be appreciated that the structure formed by method 400 comprises a p-intrinsic-n or "PiN" diode. The depletion region of the resulting PiN structure extends across the intrinsic region, e.g., through the extent of the light emitting layer. This wider depletion width enables electron-hole pair recombination throughout a large portion of the light emitting layer, thus reducing the drive voltage and increasing the quantum efficiency of the light emitting diode.

In addition, the PiN structure increases the process window for manufacturing a non-crystallite inorganic light emitting diode. For example, the PiN structure is more tolerant of process variation, e.g., variations in a thickness of the various layers and/or variations in a dopant concentration, compared to the conventional art quantum well structures. Accordingly, the PiN structure may have improved yield, in comparison to the conventional art.

Figure 5:
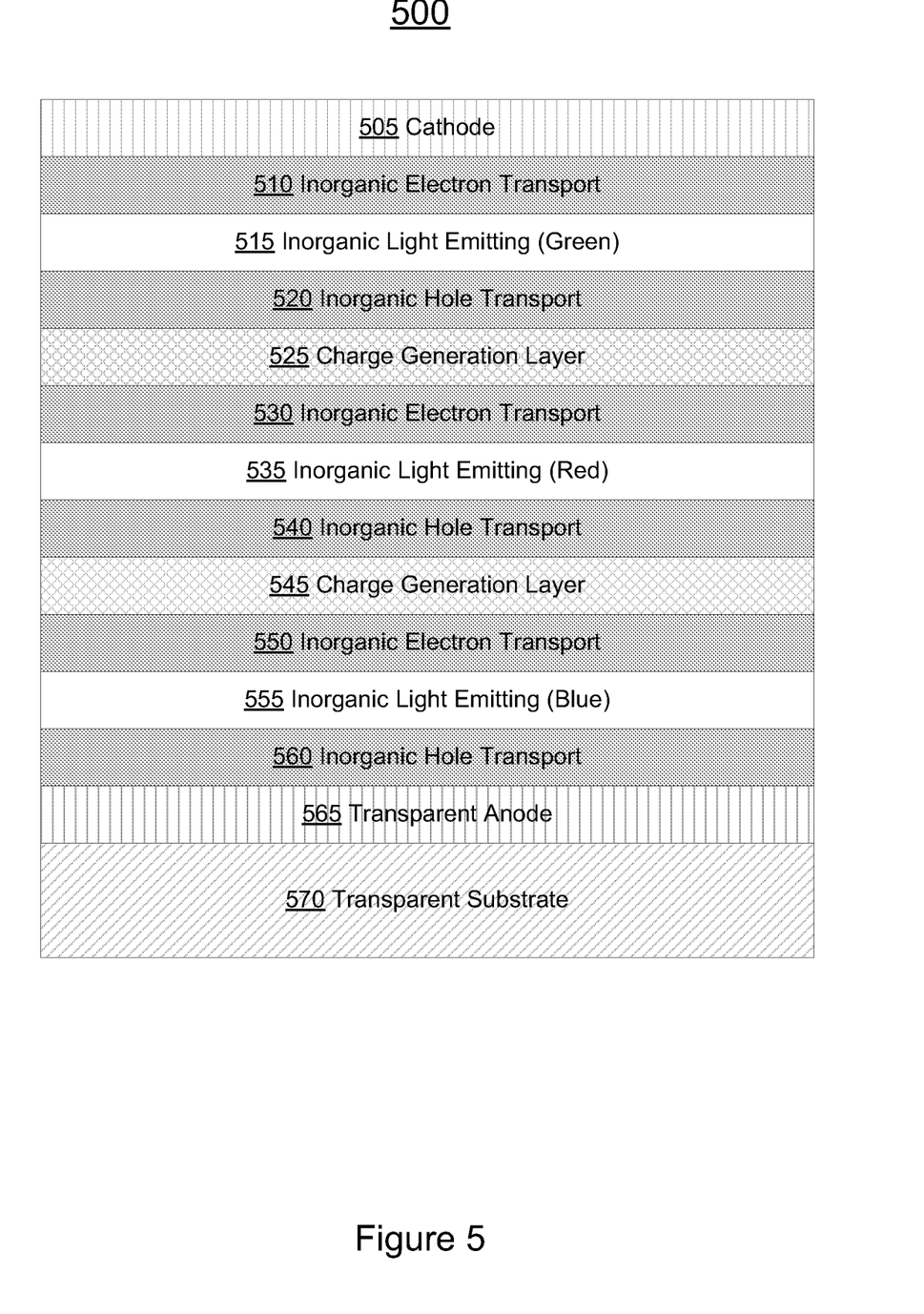
FIG. 5 illustrates a stacking structure for a non-crystalline inorganic multiple emitter light emitting diode.

FIG. 5 illustrates a stacking structure 500 for a non-crystalline inorganic multiple emitter light emitting diode. Structure 500 comprises a plurality of emitting devices, for example, three. Such devices may produce substantially the same wavelength or color of light, for example, to produce a greater intensity of light at one color.

Alternatively, the plurality of emitting devices within structure 500 may produce different wavelengths or colors of light, for example to produce non-spectral colors, or spectral colors that are not easily or typically produced by single light emitting diodes. Structure 500 is understood to describe all combinations of individual light emitting diodes.

One such application of a multi-emitter LED is to produce white light, also know as or referred to as a "multi-color white LED" or an "RGB LED." Structure 500 comprises non-crystalline inorganic emitting layers for green, red and blue light. Due to metamerism, this combination of colors may be perceived as white light.

Structure 500 comprises a transparent substrate 570. It is to be appreciated that transparent substrate 570 does not have to be lattice-matched for any of the materials in structure 500. As has been previously disclosed, transparent substrate 570 may comprise a wide variety of materials, and may be chosen for characteristics, e.g., optical, thermal and/or electrical characteristics, other than its grain structure.

Structure 500 further comprises a transparent anode 565 deposited on the transparent substrate 570, and inorganic hole transport layer 560 is deposited on the transparent anode 565. Inorganic blue light emitting layer 555, comprising, for example, indium gallium nitride ($In_xGaN_{(1-x)}$) and/or zinc selenide (ZnSe), is deposited on the inorganic hole transport layer 560. Inorganic electron transport layer 550 is deposited on the inorganic blue light emitting layer 555. Charge generation layer 545 is deposited on the inorganic electron transport layer 550.

Inorganic hole transport layer 540 is deposited on the charge generation layer 545. Inorganic red light emitting layer 535, comprising, for example, aluminum gallium arsenide (AlGaAs) and/or gallium arsenide phosphide (GaPAs), is deposited on the inorganic hole transport layer 540. Inorganic electron transport layer 530 is deposited on the inorganic red light emitting layer 535. Charge generation layer 525 is deposited on the inorganic electron transport layer 530.

Inorganic hole transport layer 520 is deposited on the charge generation layer 525. Inorganic green light emitting layer 515, comprising, for example, gallium phosphide (GaP) and/or gallium indium nitride (GaInN), is deposited on the inorganic hole transport layer 520. Inorganic electron transport layer 510 is deposited on the inorganic green light emitting layer 515. A cathode 505 is deposited on the inorganic electron transport layer 510.

It is to be appreciated that the materials comprising structure 500 are generally non-crystalline, e.g., amorphous, polycrystalline and/or nanocrystalline, and may be deposited without regard to maintaining a crystal lattice structure, e.g., via sputtering. It is to be further appreciated that crystalline forms of these materials, including the emitting layers, are not well suited to forming a lattice-matched crystalline structure comparable to structure 500.

For example, forming such a quantity of crystalline layers via crystal-growth processes, e.g., via chemical vapor deposition from gas phase sources, is prohibitively expensive. In addition, these materials, including the emitting layers, generally have different crystal lattice structures from one another, and are thus not well suited to forming a single lattice-matched crystalline structure. Further, due to the quantum well arrangement of crystalline inorganic light emitting diodes, charge transport relies on quantum tunneling in such devices. However, due to the high number of layers, and the overall length (thickness) of all such layers, charge may not be able to tunnel throughout the entire structure, and a lattice-matched crystalline structure comparable to structure 500 would not be expected to functional in general.

Figure 6:
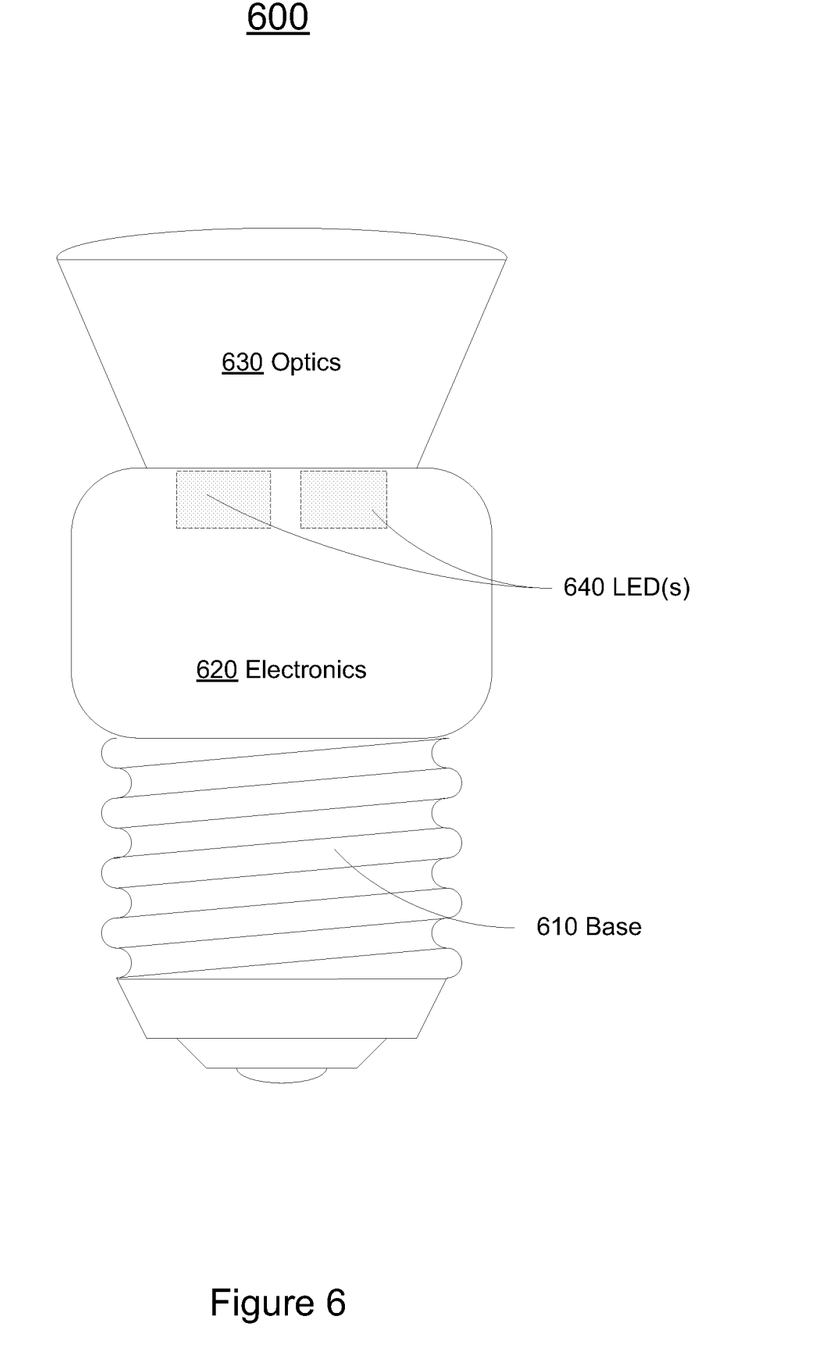
FIG. 6 illustrates an example of an application of a light emitting diode, in accordance with embodiments of the present invention.

FIG. 6 illustrates an example of an application of a light emitting diode, in accordance with embodiments of the present invention. Light source 600 is well suited to a variety of lighting applications, including domestic, industrial and landscape lighting. Light source 600 is also well suited to stage or theatrical lighting. Light source 600 comprises a base 610. As illustrated, base 610 is an Edison type base. It is appreciated that embodiments in accordance with the present invention are well suited to other types of bases, including, for example, GU, bayonet, bipin, stage pin, wedge or other type of bases.

Light source 600 additionally comprises a body portion 620 that houses power conditioning electronics (not shown) that convert 110V AC input electrical power (or 220 V AC, or other selected input electrical power) to electrical power suitable for driving a plurality of light emitting diode devices 640. Body portion 620 may also comprise, or couple to, optional heat sink features (not shown).

Light source 600 additionally comprises optional optics 630. Optics 630 comprise diffusers and/or lenses for focusing and/or diffusing light from the plurality of light emitting diode devices 640 into a desired pattern.

Light source 600 comprises a plurality of light emitting diode devices (LEDs) 640. Individual LEDs of plurality of light emitting diode devices 640 may correspond to assemblies previously described herein. For example, plurality of light emitting diode devices 640 may include instances of electronic devices 200 (FIG. 2), 300 (FIG. 3) and/or 500 (FIG. 5). It is appreciated that not all instances of plurality of light emitting diode devices 640 need be identical.

In accordance with embodiments of the present invention, plurality of light emitting diode devices 640 may include additional electronics associated with the LED devices. In one exemplary embodiment, such additional electronics may comprise circuits to implement a white balance among tri-color LEDs.

It is to be appreciated that embodiments in accordance with the present invention are well suited to panel or area lights. For example, due to the variety of available substrate materials and the flexibility of applicable application processes, the processed disclosed herein may be utilized to manufacture large panels, e.g., many square centimeters or larger, of inorganic light emitting diodes.

Figure 7:
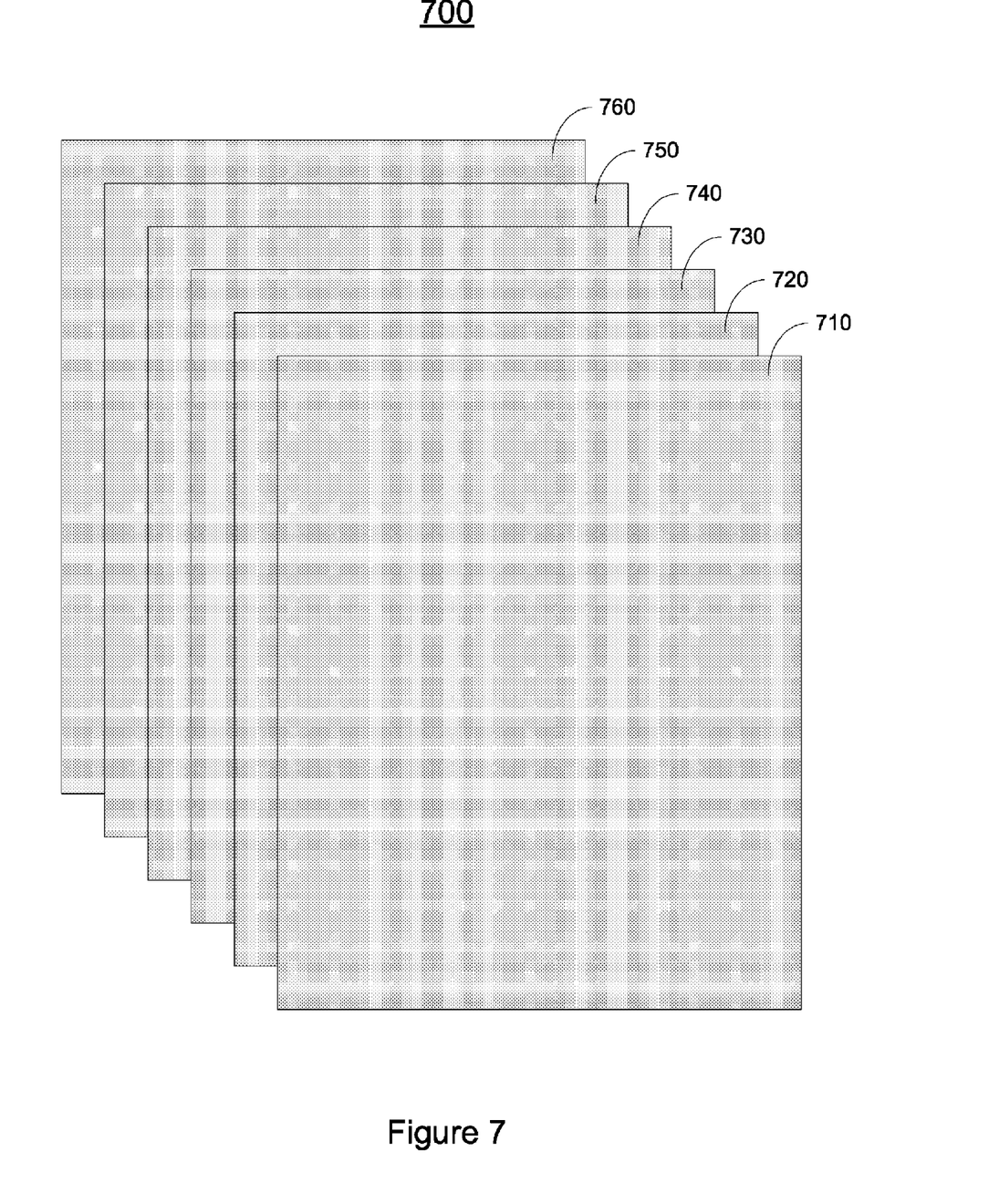
FIG. 7 illustrates an exploded view of a panel form of a non-crystalline inorganic light emitting diode, in accordance with embodiments of the present invention.

FIG. 7 illustrates an exploded view of a panel form of a non-crystalline inorganic light emitting diode 700, in accordance with embodiments of the present invention. It is to be appreciated that panel light emitting diode 700 comprises a single light emitting diode, e.g., a single instance of electronic device 200 (FIG. 2), 300 (FIG. 3) and/or 500 (FIG. 5), and is not an array of many LEDs. It is to be further appreciated that the illustrated layers would typically be aligned, and that the exploded view is presented to better illustrate embodiments in accordance with the present invention.

Panel light emitting diode 700 may generally correspond to the devices previously described, e.g., non-crystalline inorganic light emitting diode 300 as described in FIG. 3.

For example, electrode 710 may generally correspond to transparent electrode 310 of FIG. 3. Charge transport layer 720 may generally correspond to charge transport layer 320 of FIG. 3. inorganic light emitting layer 730 may generally correspond to inorganic light emitting layer 330 of FIG. 3. Charge transport layer 740 may generally correspond to charge transport layer 340 of FIG. 3. Reflective electrode 750 may generally correspond to reflective electrode of FIG. 3. Substrate 760 may generally correspond to substrate 360 of FIG. 3. It is appreciated that a metal substrate may advantageously provide high mechanical strength to support a large panel.

Panel light emitting diode 700 may be many square centimeters, e.g., four, or larger in the plane of the drawing. Panel light emitting diode 700 may be only a few millimeters thick. Additional electronics, e.g., to convert mains electricity to the appropriate voltage characteristics are not shown. Panel light emitting diode 700 may be considered to be a superior source of illumination, as it is not a "point" source, and the light cast from such a panel is considered "shadowless," harmless to human vision, cool to the touch, and may be flexible and conform to curved surfaces, including while functioning or in operation.

Embodiments in accordance with the present invention provide systems and methods for non-crystalline inorganic light emitting diodes. In addition, embodiments in accordance with the present invention provide systems and methods for non-crystalline inorganic light emitting diodes that do not require epitaxial manufacturing processes such as chemical vapor deposition (CVD) or molecular beam epitaxy (MBE). Further, embodiments in accordance with the present invention provide systems and methods for non-crystalline inorganic light emitting diodes that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. An article of manufacture comprising:
a light emitting diode comprising:
a non-crystalline inorganic light emission layer; and
first and second semiconducting non-crystalline inorganic charge transport layers surrounding said light emission layer, wherein said first and second semiconducting charge transport layers are doped to opposite conduction types.

2. The article of manufacture of claim 1 wherein said light emission layer is amorphous.

3. The article of manufacture of claim 1 wherein said charge transport layers have a thickness greater than 4.0 nm.

4. The article of manufacture of claim 1 wherein said charge transport layers are configured to conduct at least one type of charge carrier.

5. The article of manufacture of claim 1 further comprising a p-intrinsic-n (PiN) type diode.

6. The article of manufacture of claim 1 further comprising a substrate configured to support said light emitting diode.

7. The article of manufacture of claim 6 wherein said substrate conducts current to said light emitting diode.

8. The article of manufacture of claim 6 wherein said substrate comprises metal.

9. The article of manufacture of claim 6 wherein said substrate comprises a polymer.

10. The article of manufacture of claim 6 wherein said substrate is configured to be flexible when said light emitting diode is functioning.

11. The article of manufacture of claim 6 wherein said substrate with said light emitting diode applied is adaptable to a non-planar configuration.

12. The article of manufacture of claim 1 further comprising electronics to convert a source of alternating current to direct current for use by said light emitting diode; and a base to couple said electronics to said source of alternating current.

13. The article of manufacture of claim 1 comprising a single said light emitting diode of greater than 4 square centimeters.

14. An article of manufacture comprising: a light emitting diode comprising: a first non-crystalline inorganic layer configured for transporting holes and blocking electrons and having a hole transport layer (HTL) conduction band and a hole transport layer (HTL) valence band;
a second non-crystalline inorganic layer, disposed on said first layer, configured for emitting light and having an emission conduction band and a emission valence band; and
a third non-crystalline inorganic layer, disposed on said second layer, configured for transporting electrons and blocking holes and having an electron transport layer (ETL) conduction band and an electron transport layer (ETL) valence band, wherein alignment of said HTL, emission and ETL conduction bands and said HTL, emission and ETL valence bands favor both charge injection and charge confinement.

15. The article of manufacture of claim 14 wherein:close alignment of said HTL valence band to said emission valence band favors hole injection.

16. The article of manufacture of claim 14 wherein: close alignment of said emission conduction band and said ETL conduction band favors electron injection.

17. The article of manufacture of claim 14 wherein: a difference between said HTL conduction band and said emission conduction band favors electron confinement.

18. The article of manufacture of claim 14 wherein: a difference between said emission valence band and said ETL valence band favors hole confinement.

* * * * *